(12) United States Patent
Beffa

(10) Patent No.: US 7,368,678 B2
(45) Date of Patent: *May 6, 2008

(54) METHOD FOR SORTING INTEGRATED CIRCUIT DEVICES

(75) Inventor: Raymond J. Beffa, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/218,380

(22) Filed: Aug. 13, 2002

(65) Prior Publication Data

US 2002/0189981 A1 Dec. 19, 2002

Related U.S. Application Data

(63) Continuation of application No. 09/944,567, filed on Aug. 30, 2001, now Pat. No. 6,437,271, which is a continuation of application No. 09/653,101, filed on Aug. 31, 2000, now Pat. No. 6,307,171, which is a continuation of application No. 09/133,336, filed on Aug. 13, 1998, now Pat. No. 6,147,316.

(60) Provisional application No. 08/785,353, filed on Jan. 17, 1997, now Pat. No. 5,927,512.

(51) Int. Cl.
*B07C 5/344* (2006.01)

(52) U.S. Cl. ................ 209/573; 209/571; 324/158.1; 324/764

(58) Field of Classification Search ............ 209/571, 209/573; 324/158.1, 764
See application file for complete search history.

(56) References Cited

U.S. PATENT DOCUMENTS

| | | | |
|---|---|---|---|
| 4,027,246 A | 5/1977 | Caccoma et al. |
| 4,032,949 A | 6/1977 | Bierig |
| 4,150,331 A | 4/1979 | Lacher |
| 4,454,413 A | 6/1984 | Morton, Jr. |
| 4,455,495 A | 6/1984 | Masuhara et al. |
| 4,510,673 A | 4/1985 | Shils et al. |
| 4,534,014 A | 8/1985 | Ames |
| 4,667,403 A | 5/1987 | Edinger et al. |
| 4,871,963 A | 10/1989 | Cozzi |
| 4,954,453 A | 9/1990 | Venutolo |

(Continued)

FOREIGN PATENT DOCUMENTS

EP 0849675 A2 * 6/1998

(Continued)

OTHER PUBLICATIONS

Fresonke, Dean, *In-Fab Identification of Silicon Wafers with Clean, Laser Marked Barcodes*, Advanced Semiconductor Manufacturing Conference and Workshop, 1994, IEEE/SEMI, pp. 157-160.

*Primary Examiner*—Patrick Mackey
*Assistant Examiner*—Mark Hageman
(74) *Attorney, Agent, or Firm*—TraskBritt

(57) ABSTRACT

A method for sorting integrated circuit (IC) devices of the type having a substantially unique identification (ID) code, such as a fuse ID, including automatically reading the ID code of each of the IC devices and sorting the IC devices in accordance with their automatically read ID codes, is disclosed.

3 Claims, 8 Drawing Sheets

U.S. PATENT DOCUMENTS

| | | | |
|---|---|---|---|
| 4,958,373 A | 9/1990 | Usami et al. |
| 4,967,381 A | 10/1990 | Lane et al. |
| 4,985,988 A | 1/1991 | Littlebury |
| 5,003,251 A | 3/1991 | Fuoco |
| 5,043,657 A | 8/1991 | Amazeen et al. |
| 5,103,166 A | 4/1992 | Jeon et al. |
| 5,105,362 A | 4/1992 | Kotani |
| 5,110,754 A | 5/1992 | Lowrey et al. |
| 5,118,369 A | 6/1992 | Shamir |
| 5,150,331 A | 9/1992 | Harris et al. |
| 5,175,774 A | 12/1992 | Truax et al. |
| 5,197,650 A | 3/1993 | Monzen et al. |
| 5,217,834 A | 6/1993 | Higaki |
| 5,219,765 A | 6/1993 | Yoshida et al. |
| 5,226,118 A | 7/1993 | Baker et al. |
| 5,235,550 A | 8/1993 | Zagar |
| 5,253,208 A | 10/1993 | Kang |
| 5,256,562 A | 10/1993 | Vu et al. |
| 5,256,578 A | 10/1993 | Corley et al. |
| 5,271,796 A | 12/1993 | Miyashita et al. |
| 5,289,113 A | 2/1994 | Meaney et al. |
| 5,294,812 A | 3/1994 | Hashimoto et al. |
| 5,296,402 A | 3/1994 | Ryou |
| 5,301,143 A | 4/1994 | Ohri et al. |
| 5,326,709 A | 7/1994 | Moon et al. |
| 5,345,110 A | 9/1994 | Renfro et al. |
| 5,347,463 A | 9/1994 | Nakamura et al. |
| 5,350,715 A | 9/1994 | Lee |
| 5,352,945 A | 10/1994 | Casper et al. |
| 5,355,320 A | 10/1994 | Erjavic et al. |
| 5,360,747 A | 11/1994 | Larson et al. |
| 5,399,531 A | 3/1995 | Wu |
| 5,420,796 A | 5/1995 | Weling et al. |
| 5,424,652 A | 6/1995 | Hembree et al. |
| 5,428,311 A | 6/1995 | McClure |
| 5,440,240 A | 8/1995 | Wood et al. |
| 5,440,493 A | 8/1995 | Doida |
| 5,442,561 A | 8/1995 | Yoshizawa et al. |
| 5,448,488 A | 9/1995 | Oshima |
| 5,450,326 A | 9/1995 | Black |
| 5,467,304 A | 11/1995 | Uchida et al. |
| 5,477,493 A | 12/1995 | Danbayashi |
| 5,483,175 A | 1/1996 | Ahmad et al. |
| 5,495,417 A | 2/1996 | Fuduka et al. |
| 5,504,369 A | 4/1996 | Dasse et al. |
| 5,511,005 A | 4/1996 | Abbe et al. |
| 5,516,028 A | 5/1996 | Rasp et al. |
| 5,537,325 A | 7/1996 | Iwakiri et al. |
| 5,538,141 A | 7/1996 | Gross, Jr. et al. |
| 5,539,235 A | 7/1996 | Allee |
| 5,550,838 A | 8/1996 | Okajima |
| 5,563,832 A | 10/1996 | Kagami |
| 5,568,408 A | 10/1996 | Maeda |
| 5,570,293 A | 10/1996 | Tanaka et al. |
| 5,581,510 A | 12/1996 | Furusho et al. |
| 5,590,069 A | 12/1996 | Levin |
| 5,600,171 A | 2/1997 | Makihara et al. |
| 5,603,412 A | 2/1997 | Gross, Jr. et al. |
| 5,606,193 A | 2/1997 | Ueda et al. |
| 5,617,366 A | 4/1997 | Yoo |
| 5,619,469 A | 4/1997 | Joo |
| 5,625,816 A | 4/1997 | Burdick et al. |
| 5,642,307 A | 6/1997 | Jernigan |
| 5,654,204 A | 8/1997 | Anderson |
| 5,726,074 A | 3/1998 | Yabe |
| 5,764,650 A | 6/1998 | Debenham |
| 5,787,012 A | 7/1998 | Levitt |
| 5,787,190 A | 7/1998 | Peng et al. |
| 5,801,067 A | 9/1998 | Shaw et al. |
| 5,801,965 A | 9/1998 | Takagi et al. |
| 5,805,472 A | 9/1998 | Fukasawa |
| 5,822,218 A | 10/1998 | Moosa et al. |
| 5,828,778 A | 10/1998 | Hagi et al. |
| 5,837,558 A | 11/1998 | Zuniga et al. |
| 5,844,803 A | 12/1998 | Beffa |
| 5,856,923 A | 1/1999 | Jones et al. |
| 5,865,319 A | 2/1999 | Okuda et al. |
| 5,867,505 A | 2/1999 | Beffa |
| 5,889,674 A | 3/1999 | Burdick et al. |
| 5,890,807 A | 4/1999 | Igel et al. |
| 5,895,962 A | 4/1999 | Zheng et al. |
| 5,907,492 A | 5/1999 | Akram et al. |
| 5,915,231 A | 6/1999 | Beffa |
| 5,927,512 A | 7/1999 | Beffa |
| 5,963,881 A | 10/1999 | Kahn et al. |
| 5,976,899 A | 11/1999 | Farnworth et al. |
| 5,991,699 A | 11/1999 | Kulkarni et al. |
| 5,994,915 A | 11/1999 | Farnworth et al. |
| 6,000,830 A | 12/1999 | Asano et al. |
| 6,018,686 A | 1/2000 | Orso et al. |
| 6,049,624 A | 4/2000 | Wilson et al. |
| 6,055,463 A | 4/2000 | Cheong et al. |
| 6,067,507 A | 5/2000 | Beffa |
| 6,072,574 A | 6/2000 | Zeimantz |
| 6,075,216 A | 6/2000 | Nakamura et al. |
| 6,100,486 A | 8/2000 | Beffa |
| 6,122,563 A | 9/2000 | Beffa |
| 6,130,442 A * | 10/2000 | Di Zenzo et al. ............. 257/48 |
| 6,138,256 A | 10/2000 | Debenham |
| 6,147,316 A | 11/2000 | Beffa |
| 6,148,307 A | 11/2000 | Burdick et al. |
| 6,190,972 B1 | 2/2001 | Zheng et al. |
| 6,194,738 B1 | 2/2001 | Debenham et al. |
| 6,208,947 B1 | 3/2001 | Beffa |
| 6,219,810 B1 | 4/2001 | Debenham |
| 6,226,394 B1 | 5/2001 | Wilson et al. |
| 6,259,520 B1 | 7/2001 | Zeimantz |
| 6,265,232 B1 | 7/2001 | Simmons |
| 6,292,009 B1 | 9/2001 | Farnworth et al. |
| 6,307,171 B1 | 10/2001 | Beffa |
| 6,350,959 B1 | 2/2002 | Beffa |
| 6,363,295 B1 | 3/2002 | Akram |
| 6,363,329 B2 | 3/2002 | Beffa |
| 6,365,421 B2 | 4/2002 | Debenham et al. |
| 6,365,860 B1 | 4/2002 | Beffa |
| 6,365,861 B1 | 4/2002 | Beffa |
| 6,373,011 B1 | 4/2002 | Beffa |
| 6,373,566 B2 | 4/2002 | Zeimantz |
| 6,400,840 B2 | 6/2002 | Wilson et al. |
| 6,424,168 B1 | 7/2002 | Farnworth et al. |
| 6,427,092 B1 | 7/2002 | Jones et al. |
| 6,437,271 B1 * | 8/2002 | Beffa .......................... 209/573 |
| 6,441,897 B1 | 8/2002 | Zeimantz |
| 6,529,793 B1 | 3/2003 | Beffa |
| 6,534,785 B1 | 3/2003 | Farnworth et al. |
| 6,553,276 B2 | 4/2003 | Akram et al. |
| 6,588,854 B2 | 7/2003 | Wilson et al. |
| 6,594,611 B2 | 7/2003 | Beffa |
| 6,613,590 B2 | 9/2003 | Simmons |
| 6,636,068 B2 | 10/2003 | Farnworth |
| 6,654,114 B2 | 11/2003 | Zeimantz |
| 6,703,573 B2 | 3/2004 | Beffa |
| 6,788,993 B2 | 9/2004 | Beffa |
| 6,895,538 B2 | 5/2005 | Benedix et al. |
| 7,120,513 B1 | 10/2006 | Akram et al. |
| 7,155,300 B2 | 12/2006 | Akram et al. |
| 2004/0024551 A1 | 2/2004 | Beffa |

FOREIGN PATENT DOCUMENTS

| | | |
|---|---|---|
| JP | 58-50728 | 3/1983 |
| JP | 58052814 A | 3/1983 |
| JP | 58-60529 | 4/1983 |
| JP | 361120433 | 6/1986 |

| | | | | | | | |
|---|---|---|---|---|---|---|---|
| JP | 02164017 A | 6/1990 | | JP | 06349691 A | 12/1994 |
| JP | 02246312 A | 10/1990 | | JP | 07050233 | 2/1995 |
| JP | 04080949 A | 3/1992 | | JP | 07066091 A | 3/1995 |
| JP | 04318911 A | 11/1992 | | JP | 07-335510 | 12/1995 |
| JP | 405013529 | 1/1993 | | JP | 08162380 A | 6/1996 |
| JP | 4-74909 | 3/1993 | | JP | 410104315 A | 4/1998 |
| JP | 05121573 A | 5/1993 | | JP | 11008327 | 1/1999 |
| JP | 05315207 | 11/1993 | | SU | 1151-333 | 4/1985 |
| JP | 06013443 A | 1/1994 | | | | |
| JP | 06267809 A | 9/1994 | | * cited by examiner | | |

METHOD FOR SORTING INTEGRATED CIRCUIT DEVICES

CROSS-REFERENCE TO RELATED APPLICATIONS

This application is a continuation of application Ser. No. 09/944,567, filed Aug. 30, 2001, now U.S. Pat. No. 6,437,271 B1, issued Aug. 20, 2002, which is a continuation of application Ser. No. 09/653,101, filed Aug. 31, 2000, now U.S. Pat. No. 6,307,171 B1, issued Oct. 23, 2001, which is a continuation of application Ser. No. 09/133,336, filed Aug. 13, 1998, now U.S. Pat. 6,147,316, issued Nov. 14, 2000, which is a divisional of application Ser. No. 08/785,353, filed Jan. 17, 1997, now U.S. Pat. No. 5,927,512, issued Jul. 27, 1999.

The present application is also related to: application Ser. No. 08/591,238, filed Jan. 17, 1996, now abandoned; application Ser. No. 08/664,109, filed Jun. 13, 1996, now U.S. Pat. No. 5,895,962, issued Apr. 20, 1999; a divisional application having Ser. No. 09/133,336, filed Aug. 13, 1998, now U.S. Pat. No. 6,147,316, issued Nov. 14, 2000; an application having Ser. No. 08/822,731, filed Mar. 24, 1997, now U.S. Pat. No. 5,856,923, issued Jan. 5, 1999; an application having Ser. No. 08/806,442, filed Feb. 26, 1997, now U.S. Pat. No. 5,915,231, issued Jun. 22, 1999; an application having Ser. No. 08/871,015, filed Jun. 6, 1997, now U.S. Pat. No. 5,907,492, issued May 25, 1999; and an application having Ser. No. 08/801,565 filed Feb. 17, 1997, now U.S. Pat. No. 5,844,803, issued Dec. 1, 1998.

BACKGROUND OF THE INVENTION

1. Field of the Invention

The present invention relates in general to integrated circuit (IC) manufacturing and, more specifically, to methods in IC manufacturing processes for sorting IC devices using identification (ID) codes, such as fuse IDs, in the devices.

2. State of the Art

Integrated circuits (ICs) are small electronic circuits formed on the surface of a wafer of semiconductor material, such as silicon, in an IC manufacturing process referred to as "fabrication." Once fabricated, ICs are electronically probed to evaluate a variety of their electronic characteristics, cut from the wafer on which they were formed into discrete IC dice or "chips," and then assembled for customer use using various well-known IC packaging techniques, including lead frame packaging, Chip-On-Board (COB) packaging, and flip-chip packaging.

Before being shipped to customers, packaged ICs are generally tested to ensure they will function properly once shipped. Testing typically involves a variety of known test steps, such as pre-grade, burn-in, and final, which test ICs for defects and functionality and grade ICs for speed. As shown in FIG. 1, ICs that pass the described testing are generally shipped to customers, while ICs that fail the testing are typically rejected.

The testing standards for a particular IC product are sometimes relaxed as the product "matures," such that ICs previously rejected under strict testing standards may pass the relaxed testing standards. Consequently, reject bins containing previously rejected ICs are sometimes "culled" for ICs that are shippable under relaxed testing standards by testing the rejected ICs again using the relaxed testing standards. Unfortunately, while this culling process does retrieve shippable ICs from reject bins, it makes inefficient use of expensive and often limited testing resources by diverting those resources away from testing untested ICs in order to retest previously rejected ICs. Therefore, there is a need in the art for an improved method of culling or sorting such reject bins for shippable ICs.

Similarly, as shown in FIG. 2, all the ICs from the wafers in a wafer lot typically undergo enhanced reliability testing that is more extensive and strict than normal testing when any of the wafers in the lot are deemed to be unreliable because of fabrication or other process errors. Since a wafer lot typically consists of fifty or more wafers, many of the ICs that undergo the enhanced reliability testing do not require it because they come from wafers that are not deemed unreliable. Performing enhanced reliability testing on ICs that do not need it is inefficient because such testing is typically more time-consuming and uses more resources than normal testing. Therefore, there is a need in the art for a method of sorting ICs from a wafer lot into those ICs that require enhanced reliability testing and those that do not.

Likewise, as shown in FIG. 3, a new or special "recipe" for fabricating ICs on wafers is sometimes tested by fabricating some wafers from a wafer lot using the special recipe and other wafers from the wafer lot using a control recipe. ICs from the wafers then typically undergo separate assembly and test procedures so that the test results of ICs fabricated using the special recipe are not mixed with the test results of ICs fabricated using the control recipe, and vice versa. Test reports from the separate test procedures are then used to evaluate the special recipe and to determine whether the ICs are to be shipped to customers, reworked, repaired, retested, or rejected. Unfortunately, because the ICs undergo separate test and assembly procedures, undesirable variables, such as differences in assembly and test equipment, are introduced into the testing of the special recipe. It would be desirable, instead, to be able to assemble and test the ICs using the same assembly and test procedures, and to then sort the ICs and their test results into those ICs fabricated using the special recipe and those ICs fabricated using the control recipe. Therefore, there is a need in the art for a method of identifying individual ICs fabricated using a special or control recipe and sorting the ICs based on their fabrication recipe.

As described above, ICs are typically tested for various characteristics before being shipped to customers. For example, as shown in FIG. 4, ICs may be graded in test for speed and placed in various bins (e.g., 5 nanoseconds (ns), 6 ns, and 7 ns bins) according to their grading. If a customer subsequently requests a more stringent speed grade (e.g., 4 ns), ICs in one of the bins (e.g., a 5 ns bin) are retested and thereby sorted into ICs that meet the more stringent speed grade (e.g., 4 ns bin) and those that do not (e.g., 5 ns bin). While this conventional process sorts the ICs into separate speed grades, it makes inefficient use of expensive and often limited testing resources by diverting those resources away from testing untested ICs in order to retest previously tested ICs. Therefore, there is a need in the art for an improved method of culling or sorting bins for ICs that meet more stringent standards, such as a higher speed grading.

As described in U.S. Pat. Nos. 5,301,143, 5,294,812, and 5,103,166, some methods have been devised to electronically identify individual ICs. Such methods take place "off" the manufacturing line and involve the use of electrically retrievable ID codes, such as so-called "fuse IDs," programmed into individual ICs to identify the ICs. The programming of a fuse ID typically involves selectively blowing an arrangement of fuses and anti-fuses in an IC so that when the fuses or anti-fuses are accessed, they output a selected ID code. Unfortunately, none of these methods address the problem of identifying and sorting ICs "on" a manufacturing line.

BRIEF SUMMARY OF THE INVENTION

An inventive method for sorting integrated circuit (IC) devices of the type to have a substantially unique identification (ID) code, such as a fuse ID, including automatically reading the ID code of each of the IC devices and sorting the IC devices according to their automatically read IID codes. The inventive method can be used in conjunction with an IC manufacturing process that includes providing semiconductor wafers, fabricating the ICs on each of the wafers, causing each of the ICs to store its ID code, separating each of the ICs from its wafer to form an IC die, assembling the IC dice into IC devices, and testing the IC devices. The method can also be used in conjunction with Single In-line Memory Module (SIMM), Dual In-line Memory Module (DIMM), and other multi-chip module (MCM) manufacturing processes.

In another embodiment, an inventive method for recovering IC devices from a group of IC devices that have previously been rejected in accordance with a test standard that has since been relaxed includes: storing test results that caused each of the IC devices in the group to be rejected in connection with an ID code, such as a fuse ID, associated with each device; automatically reading the ID code from each of the IC devices; accessing the test results stored in connection with each of the automatically read ID codes; comparing the accessed test results for each of the IC devices with the relaxed test standard; and sorting the IC devices according to whether their accessed test results pass the relaxed test standard in order to recover any of the IC devices having test results that pass the relaxed test standard.

By sorting the IC devices in accordance with their previously stored test results and their ID codes, the above-described inventive method eliminates the need to retest the IC devices after the test standard is relaxed in order to cull shippable IC devices from the rejected devices.

In still another embodiment, a method for sorting a group of IC devices in accordance with a first IC standard, such as a speed standard, that have previously been sorted in accordance with a second IC standard, such as a speed standard, that is less stringent than the first IC standard, includes storing test results that caused each of the IC devices in the group to be sorted into the group in connection with ID codes, such as fuse IDs, of the devices, automatically reading the ID code from each of the IC devices, accessing the test results stored in connection with each of the automatically read ID codes, comparing the accessed test results for each of the IC devices with the first IC standard, and sorting the IC devices according to whether their test results pass the first IC standard.

In a further embodiment, an inventive back-end test method for separating IC devices in need of enhanced reliability testing from a group of IC devices undergoing back-end test procedures includes: storing a flag in connection with an ID code, such as a fuse ID, associated with each of the IC devices in the group indicating whether each IC device is in need of enhanced reliability testing; automatically reading the ID code of each of the IC devices in the group; accessing the enhanced reliability testing flag stored in connection with each of the automatically read ID codes; and sorting the IC devices in accordance with whether their enhanced reliability testing flag indicates that they are in need of enhanced reliability testing.

Thus, the inventive method described above provides an advantageous method for sorting ICs from the same wafer lot into those ICs that require enhanced reliability testing and those that do not.

In a still further embodiment, an inventive method in an IC manufacturing process for testing different fabrication process recipes includes the following: providing first and second pluralities of semiconductor wafers; fabricating a first plurality of ICs on each of the first plurality of wafers in accordance with a control recipe; fabricating a second plurality of ICs on each of the second plurality of wafers in accordance with a test recipe; causing each of the ICs on each of the wafers to permanently store a substantially unique ID code, such as a fuse ID; separating each of the ICs on each of the wafers from its wafer to form one of a plurality of IC dice; assembling each of the IC dice into an IC device; automatically reading the ID code from the IC in each of the IC devices; testing each of the IC devices; and sorting each of the IC devices in accordance with the automatically read ID code from the IC in each of the IC devices indicating that the IC is from one of the first and second pluralities of ICs.

DETAILED DESCRIPTION OF THE INVENTION

Figure 1:
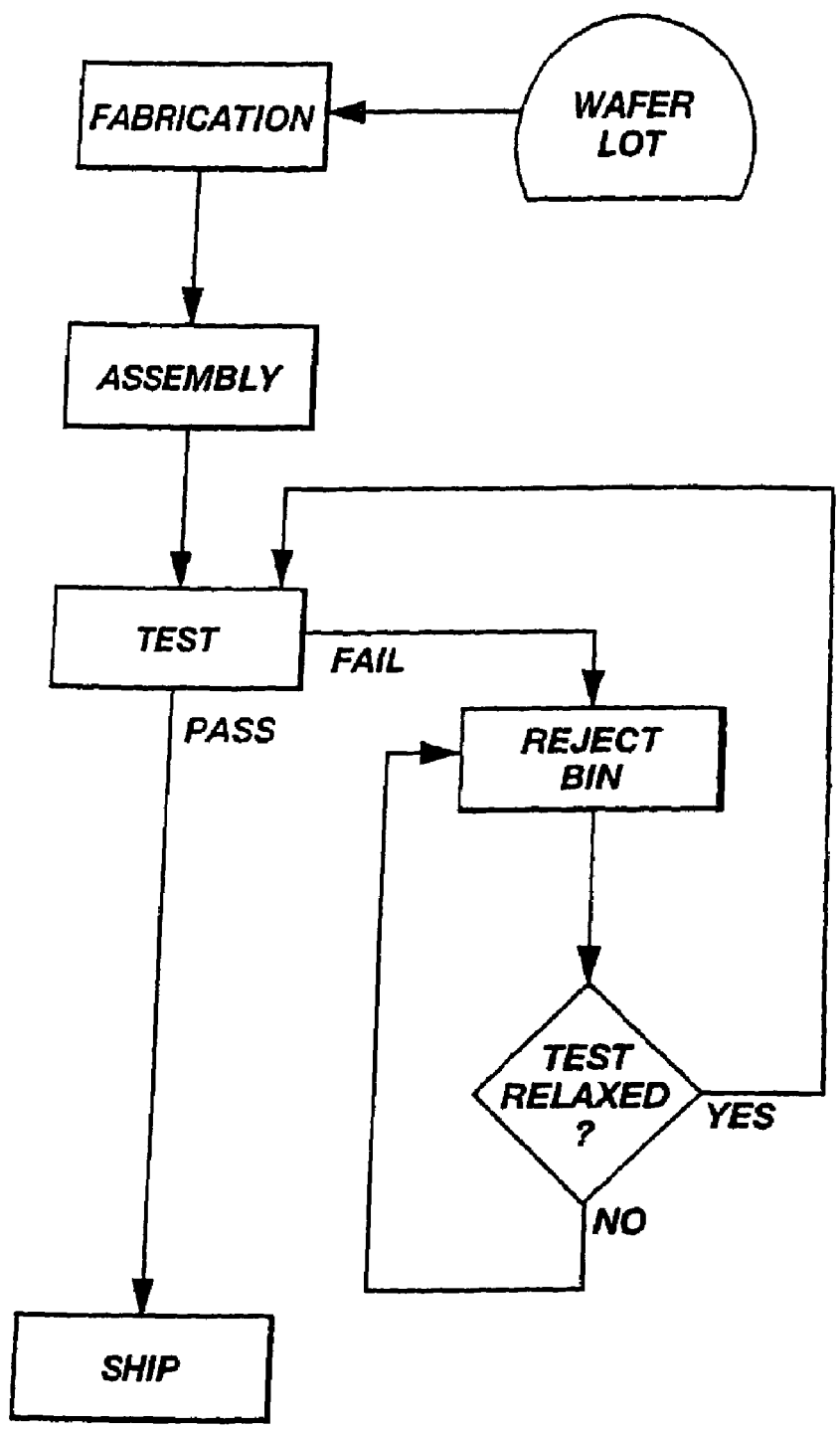
FIG. 1 is a flow diagram illustrating a conventional procedure in an integrated circuit (IC) manufacturing process for culling shippable ICs from a reject bin.
Figure 2:
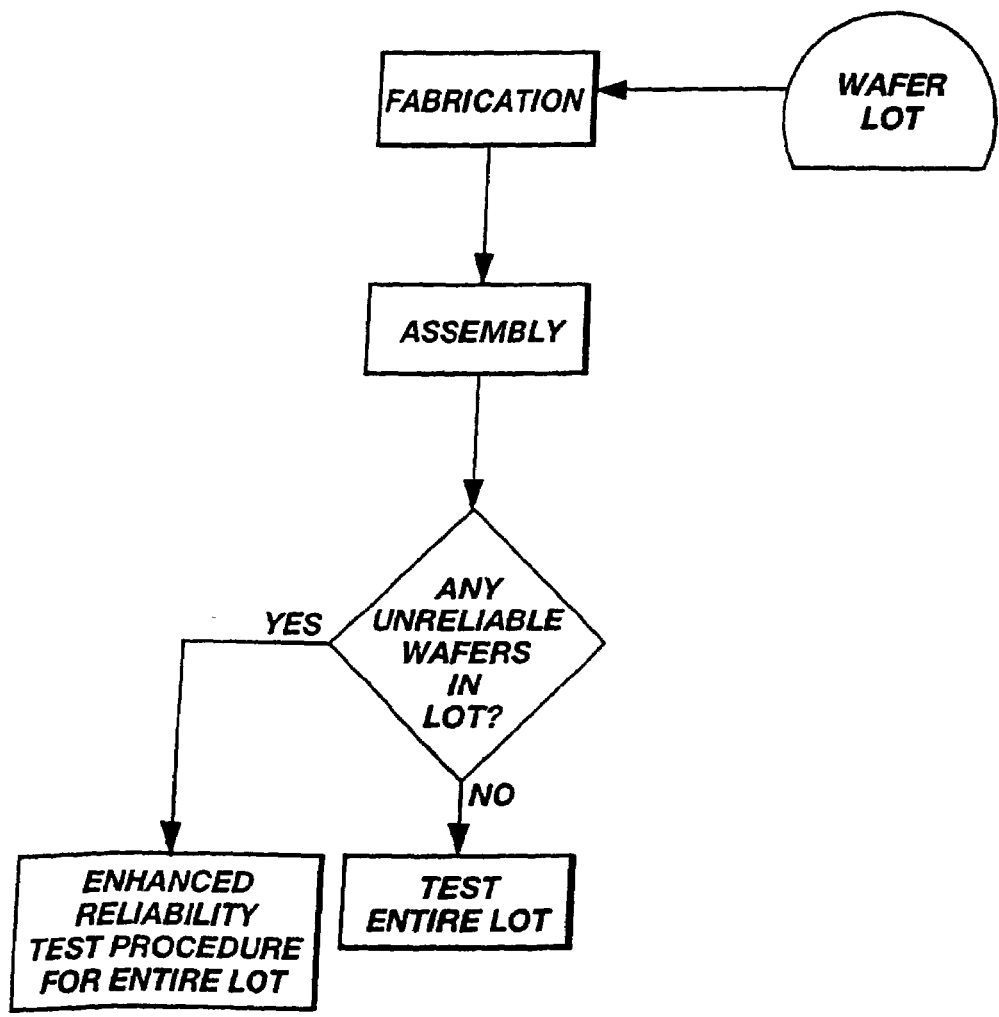
FIG. 2 is a flow diagram illustrating a conventional procedure in an IC manufacturing process for directing ICs to enhanced reliability testing.
Figure 3:
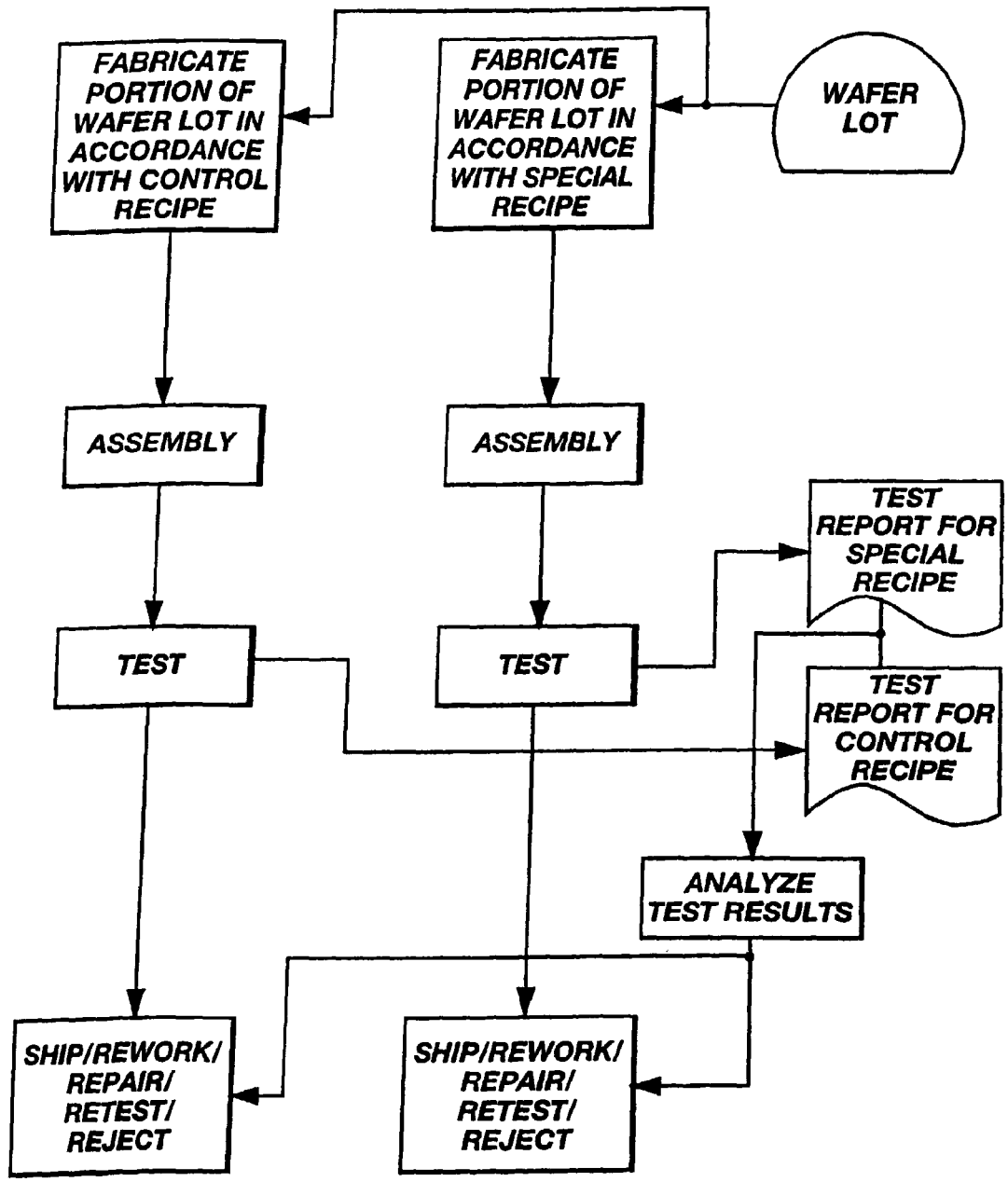
FIG. 3 is a flow diagram illustrating a conventional procedure in an IC manufacturing process for testing a new or special fabrication process recipe.
Figure 4:
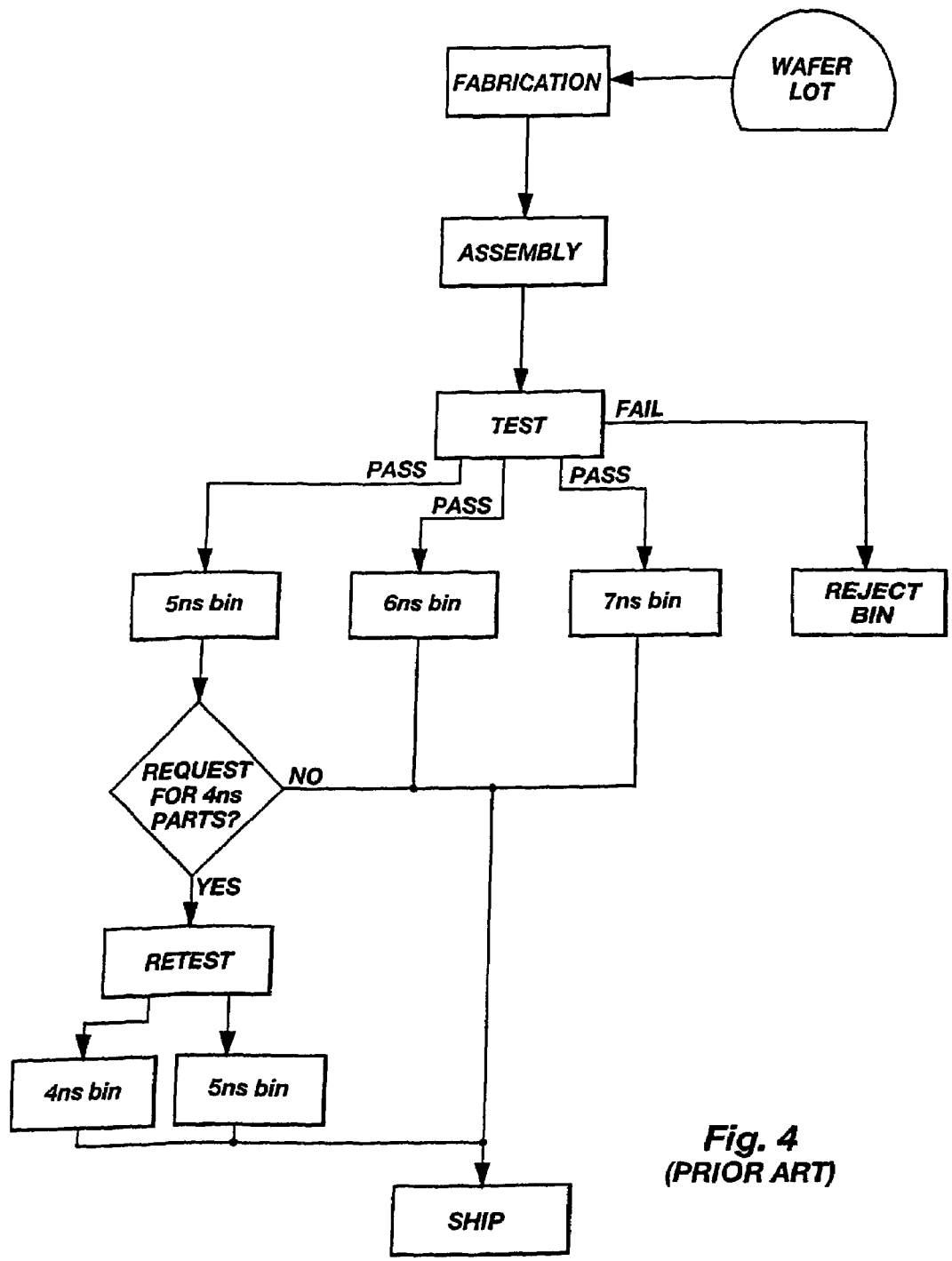
FIG. 4 is a flow diagram illustrating a conventional procedure in an IC manufacturing process for speed sorting ICs.
Figure 5:
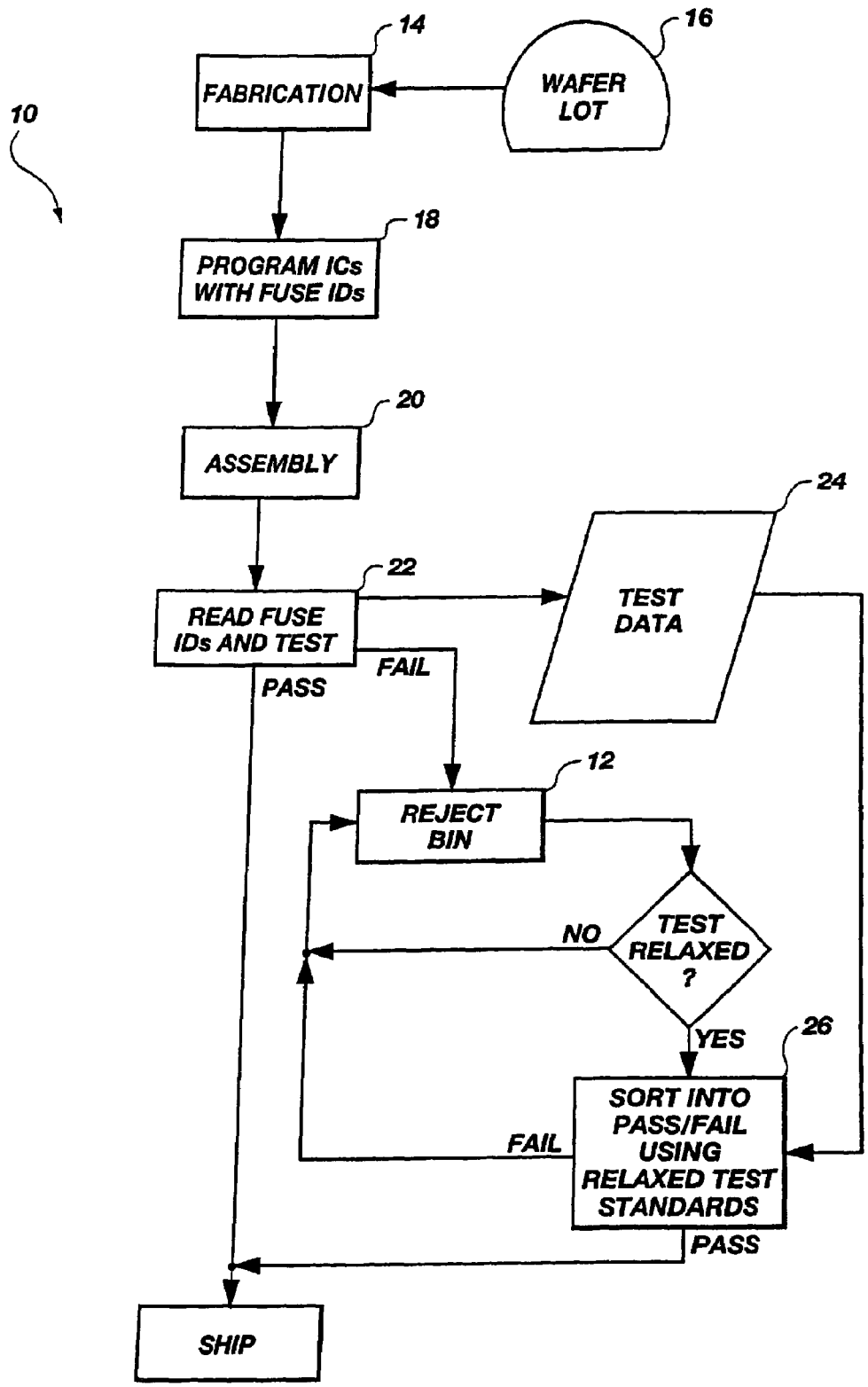
FIG. 5 is a flow diagram illustrating a procedure in an integrated circuit (IC) manufacturing process for culling shippable ICs from a reject bin in accordance with the present invention.

As shown in FIG. 5, an inventive method for sorting integrated circuit (IC) devices is embodied in a method 10 in an IC manufacturing process for culling shippable ICs from a reject bin 12. It will be understood by those having skill in the field of this invention that the present invention is applicable to sorting any IC devices, including Dynamic Random Access Memory (DRAM) ICs, Static Random Access Memory (SRAM) ICs, Synchronous DRAM (SDRAM) ICs, processor ICs, Single In-line Memory Modules (SIMMs), Dual In-line Memory Modules (DIMMs), and other Multi-Chip Modules (MCMs).

The method 10 includes the step of fabricating 14 ICs on wafers from a wafer lot 16. ICs fabricated on the wafers are then programmed in a program step 18 in the manner described above with a fuse identification (ID) unique to each IC. The fuse ID may identify a wafer lot ID, the week the ICs were fabricated, a wafer ID, a die location on the wafer, and a fabrication facility ID. It will be understood, of course, that the present invention includes within its scope ICs having any ID code, including those having fuse IDs. It will also be understood that the ID code for each IC need not be unique, but instead may only specify the wafer the IC comes from, for example.

Once programmed, the ICs proceed through an assembly step 20 to a test step 22 where the fuse IDs are automatically read and stored in association with test data 24 generated in the test step 22. Although the fuse IDs are typically read electronically, it will be understood that they may also be read optically if the fuse ID consists of "blown" laser fuses that are optically accessible. It will also be understood that the test data 24 may include data such as the following: data identifying the testing equipment that tested the ICs, operating personnel who operated the testing equipment, and the set-up of the equipment when the ICs were tested; and data indicating the time and date the ICs were tested, the yield of shippable ICs through the test step 22, and test results for the ICs from the various stages of the test step 22.

ICs that pass the test step 22 are typically shipped to customers, while those that fail the test step 22 are directed to the reject bin 12. At a point in time when test standards of the test step 22 have been relaxed as described above, the ICs in the reject bin 12 are sorted in a sort step 26 by reading the fuse ID of each IC, accessing the test data 24 associated with the fuse ID, and comparing the accessed test data 24 with the relaxed test standards. Those ICs that fail even the relaxed test standards are directed back to the reject bin 12, while those ICs that pass the relaxed test standards are typically shipped to customers. The method 10 thus successfully culls shippable ICs from the reject bin 12 without retesting the ICs.

Figure 6:
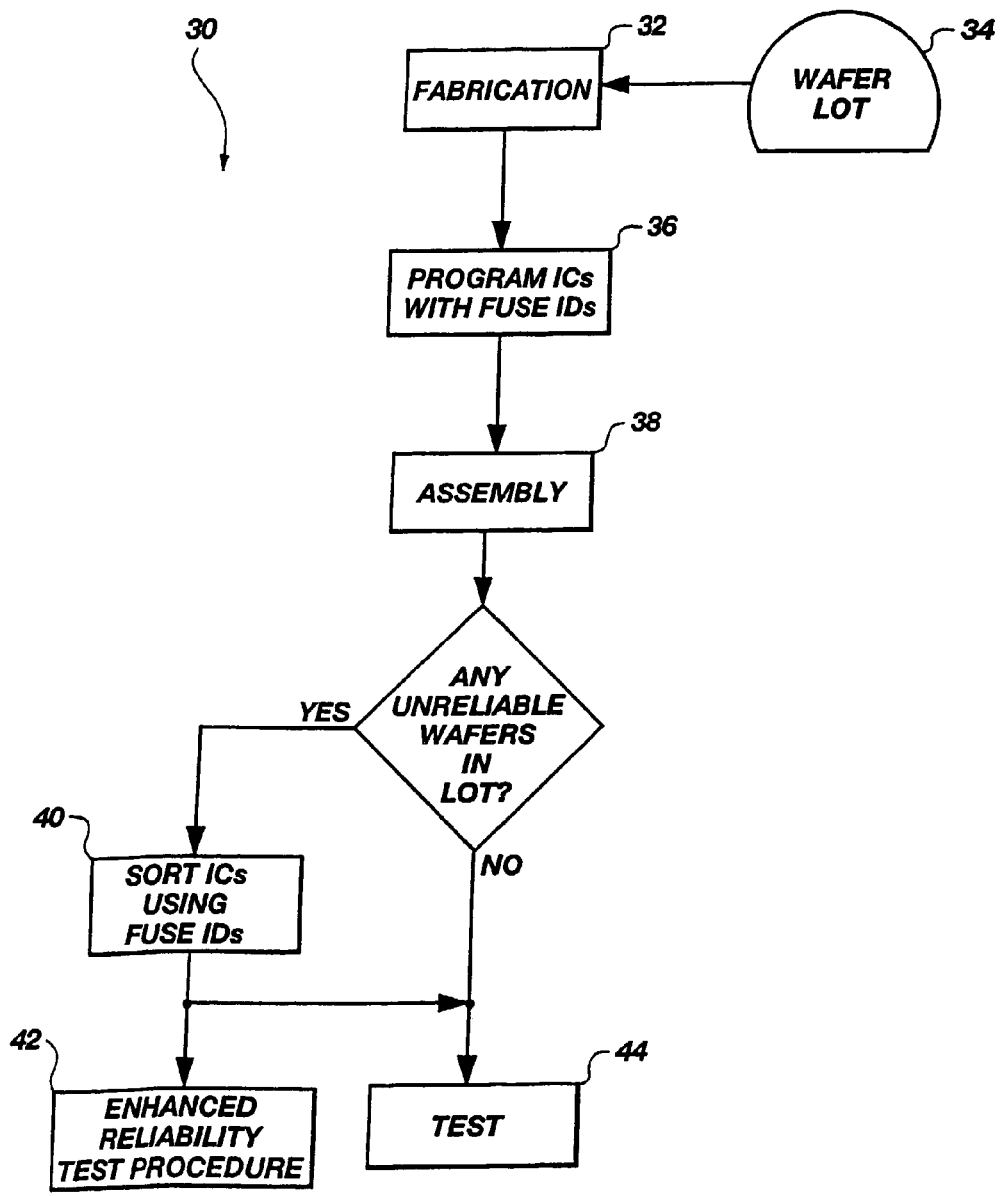
FIG. 6 is a flow diagram illustrating a procedure in an IC manufacturing process for directing ICs to enhanced reliability testing in accordance with another embodiment of the present invention.

As shown in FIG. 6, the inventive sorting method is also embodied in a back-end (i.e., after fabrication) test method 30 for separating ICs in need of enhanced reliability testing from a group of ICs undergoing back-end test procedures. ICs typically require enhanced reliability testing because the wafer they come from is unreliable as a result of fabrication errors and other unintended manufacturing process deviations.

The method 30 includes the step 32 of fabricating ICs on wafers from a wafer lot 34. ICs fabricated on the wafers are then programmed in a program step 36 in the manner described above with a fuse identification (ID) unique to each IC. The fuse ID may identify a wafer lot ID, the week the ICs were fabricated, a wafer ID, a die location on the wafer, and a fabrication facility ID. It will be understood, of course, that the present invention includes within its scope ICs having any ID code, including those having fuse IDs. It will also be understood that the ID code for each IC need not be unique, but instead may only specify the wafer the IC comes from, for example.

Once programmed, the ICs proceed through an assembly step 38. At this point in the IC manufacturing process, it is not uncommon for a number of wafers to have been identified as being unreliable for the reasons stated above. The fuse IDs of the ICs that come from these unreliable wafers may then be associated with a stored flag indicating the ICs come from unreliable wafers. If any wafers in the wafer lot 34 have been identified as being unreliable, the ICs proceed to a sort step 40, where their fuse IDs are automatically read so the ICs can be sorted into those flagged as coming from the unreliable wafers that require processing through an enhanced reliability testing step 42 and those not flagged as coming from the unreliable wafers that may proceed through a standard test step 44. Of course, those ICs that pass either the standard test step 44 or the enhanced reliability testing step 42 are typically shipped to customers, while those that fail these steps are directed to a reject bin (not shown).

Thus, the present invention provides a method 30 that directs those ICs needing enhanced reliability testing to the enhanced reliability testing step 42, while allowing those that do not require enhanced reliability testing to proceed through the standard testing step 44.

Figure 7:
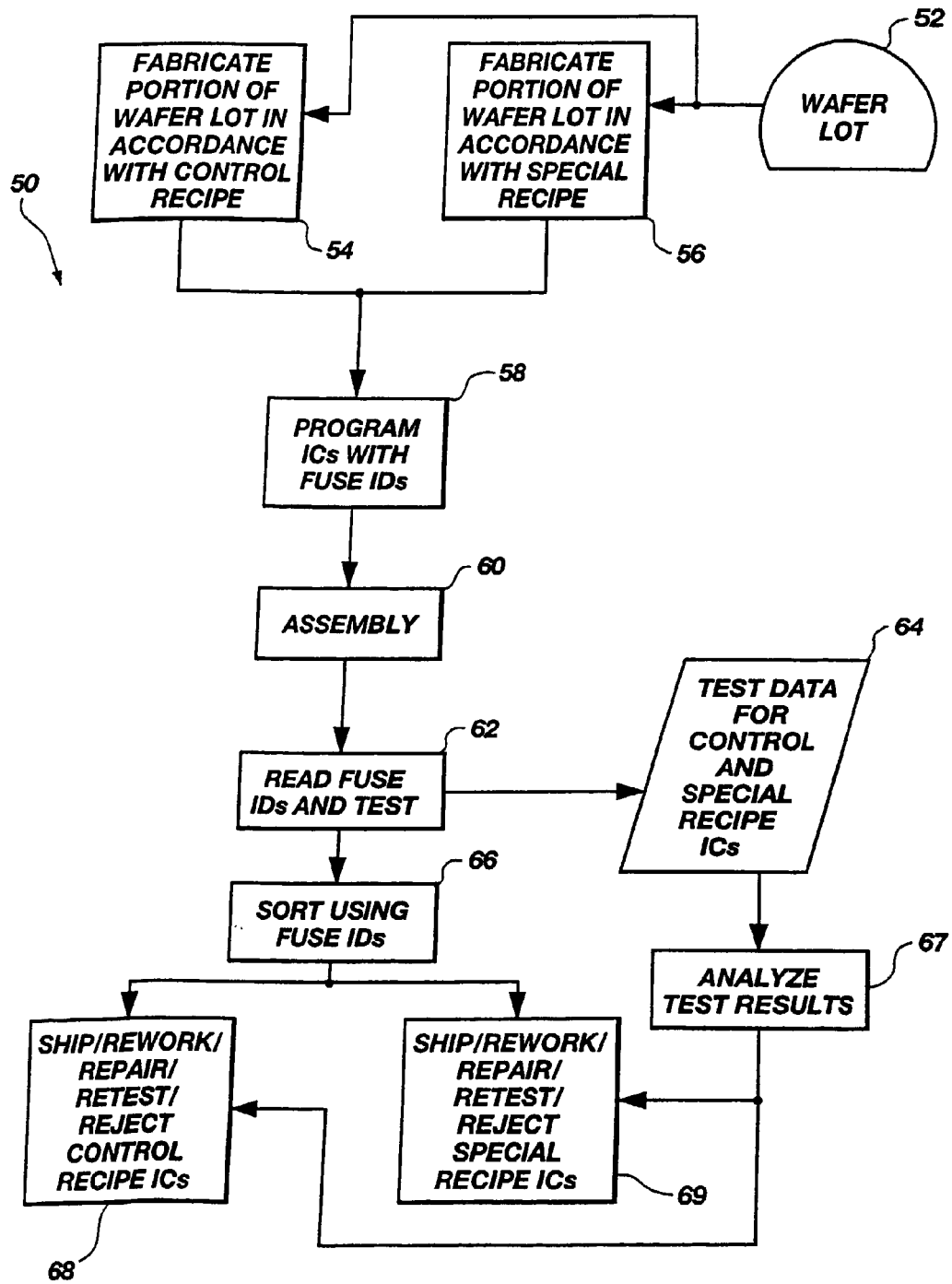
FIG. 7 is a flow diagram illustrating a procedure in an IC manufacturing process for testing a new or special fabrication process recipe in accordance with still another embodiment of the present invention.

As shown in FIG. 7, the inventive sorting method is further embodied in a method 50 for testing different fabrication process recipes. Such testing is typically done in accordance with a Special Work Request (SWR) from an engineer or technician.

The method 50 includes fabricating some of the wafers from a wafer lot 52 in a fabrication step 54 in accordance with a control process recipe that is typically the normal process recipe in use in the IC manufacturing process at the time. The remainder of the wafers from the wafer lot 52 is fabricated in another fabrication step 56 in accordance with a special or test process recipe. The special or test process recipe may change a variety of variables in the fabrication process, including doping, the thickness of IC layers, etc.

Once the ICs are fabricated in the fabrication steps 54 and 56, the ICs are then programmed in a program step 58 in the manner described above with a fuse identification (ID) unique to each IC. The fuse ID may identify a wafer lot ID, the week the ICs were fabricated, a wafer ID, a die location on the wafer, and a fabrication facility ID. It will be understood, of course, that the present invention includes within its scope ICs having any ID code, including those having fuse IDs. It will also be understood that the ID code for each IC need not be unique, but instead may only specify the wafer the IC comes from, for example.

Once programmed, the ICs proceed through an assembly step 60 to a test step 62 where the fuse IDs are automatically read and stored in association with test data 64 generated for both the control recipe ICs and the special or test recipe ICs in the test step 62. Although the fuse IDs are typically read electronically, it will be understood that they may also be read optically if the fuse ID consists of "blown" laser fuses that are optically accessible. It will also be understood that the test data 64 may include data such as the following: data identifying the testing equipment that tested the ICs, operating personnel who operated the testing equipment, and the set-up of the equipment when the ICs were tested; and data indicating the time and date the ICs were tested, the yield of shippable ICs through the test step 62, and test results for the ICs from the various stages of the test step 62.

Once the test data 64 is generated, the data 64 may be analyzed 67 to determine those ICs that are shippable and those that are not, and to determine any differences in test results between the control recipe ICs and the special or test recipe ICs. The ICs are sorted in a sort step 66 so they may be shipped, reworked, repaired, retested, or rejected in accordance with the analysis of the test results.

By sorting the control recipe 68 and special or test recipe 69 ICs at the end of the IC manufacturing process, the method 50 is able to assemble and test the ICs together and thus eliminate unintended variables introduced into the process of testing the special or test recipe by the conventional method of assembling and testing the ICs separately. The inventive method 50 thus provides more reliable test results.

Figure 8:
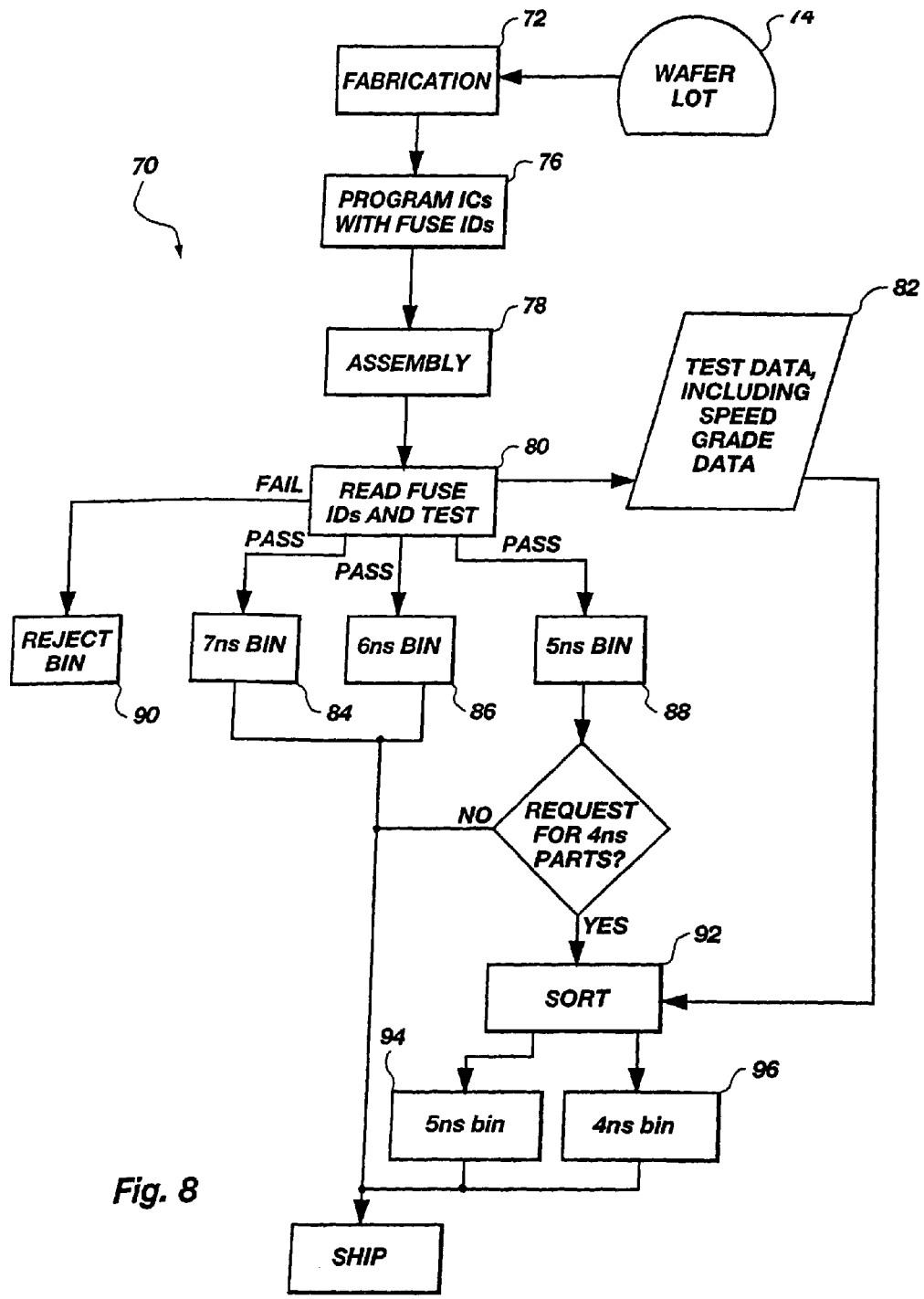
FIG. 8 is a flow diagram illustrating a procedure in an IC manufacturing process for speed sorting ICs in accordance with a further embodiment of the present invention.

As shown in FIG. 8, the inventive method for sorting IC devices is also embodied in a method 70 in an IC manufacturing process for sorting IC devices in accordance with an IC standard, such as speed, that is more stringent than an IC standard that the devices were previously sorted in accordance with. It will be understood that although the method of FIG. 8 will be described with respect to speed sorting, the method is applicable to all situations in which ICs previously sorted in accordance with an IC standard, such as speed, need to be sorted in accordance with another, more stringent IC standard. Such IC standards may include, for example, access time, data setup time, data hold time, standby current, refresh current, and operating current.

The method 70 includes the step 72 of fabricating ICs on wafers from a wafer lot 74. ICs fabricated on the wafers are then programmed in a program step 76 in the manner described above with a fuse identification (ID) unique to each IC. The fuse ID may identify a wafer lot ID, the week the ICs were fabricated, a wafer ID, a die location on the wafer, and a fabrication facility ID. It will be understood, of course, that the present invention includes within its scope ICs having any ID code, including those having fuse IDs.

Once programmed, the ICs proceed through an assembly step 78 to a test step 80 where the fuse IDs are automatically read and stored in association with test data 82 generated in the test step 80. Although the fuse IDs are typically read electronically, it will be understood that they may also be read optically if the fuse ID consists of "blown" laser fuses that are optically accessible. It will also be understood that the test data 82 includes speed-grading data for each IC, as described above, and may include data such as the following: data identifying the testing equipment that tested the ICs, operating personnel who operated the testing equipment, and the set-up of the equipment when the ICs were tested; and data indicating the time and date the ICs were tested, the yield of shippable ICs through the test step 80, and test results for the ICs from the various stages of the test step 80.

ICs that pass the test step 80 are typically directed to speed-graded bins 84, 86, and 88, while those that fail the test step 80 are directed to a reject bin 90. The speed-graded bins 84, 86, and 88 typically each contain ICs of varying speeds. For example, the bin 88 may contain a variety of 5.0 ns, 4.5 ns, 4.0 ns, 3.5 ns, etc., parts, the bin 86 may contain a variety of 6.0 ns, 5.5 ns, 5.1 ns, etc., parts, and the bin 84 may contain a variety of 7.0 ns, 6.5 ns, 6.1 ns, etc., parts.

On occasion, customers request ICs that meet a more stringent speed standard (e.g., 4 nanoseconds (ns)) than any of the ICs in the various bins 84, 86, and 88 have been graded for. While bin 88, for example, may contain ICs that will meet the more stringent speed standard, the bin 88 cannot be used to supply the customer's request because the ICs in the bin 88 have only been graded (i.e., are guaranteed to meet or exceed) a lower speed standard (e.g., 5 ns). Therefore, the present inventive method 70 sorts the ICs in a sort step 92 by reading the fuse ID of each IC, accessing the test data 82, including the speed-grading data, associated with the fuse ID, and comparing the accessed speed-grading data with the more stringent speed standard (e.g., 4 ns). Those ICs that fail the more stringent speed standard are directed to a speed-graded bin 94, while those ICs that pass the more stringent speed standard are directed to another speed-graded bin 96 where they can be used to fill the customer's request. The inventive method 70 thus sorts the ICs in accordance with a more stringent IC standard, such as speed, than they were previously sorted in accordance with the present invention without having to retest the ICs, and thus without reusing valuable testing resources to retest ICs.

Although the present invention has been described with reference to particular embodiments, the invention is not limited to these described embodiments. For example, while the various steps of the embodiments of the inventive sorting method have been described as occurring in a particular order, it will be understood that these steps need not necessarily occur in the described order to fall within the scope of the present invention. Thus, the invention is limited only by the appended claims, which include within their scope, all equivalent methods that operate according to the principles of the invention as described.

What is claimed is:

1. A method in an integrated circuit process for determining at least one integrated circuit device in need of enhanced reliability testing from at least one group of integrated circuit devices undergoing test procedures, the integrated circuit devices of the at least one group each having a substantially unique identification code, the method comprising:

storing an enhanced reliability testing flag in connection with the substantially unique identification code of each integrated circuit device of the integrated circuit devices in the at least one group indicating whether each integrated circuit device requires the enhanced reliability testing;

automatically reading the substantially unique identification code of each integrated circuit device of the integrated circuit devices in the at least one group;

accessing the enhanced reliability testing flag stored in connection with each of the automatically read substantially unique identification codes of each integrated circuit device of the integrated circuit devices in the at least one group having the substantially unique identification code thereof read;

sorting the integrated circuit devices in the at least one group in accordance with the enhanced reliability testing flag indicating the integrated circuit devices in the at least one group are in need of the enhanced reliability testing; and performing testing of integrated circuit devices in the at least one group only in need of the enhanced reliability testing.

2. A method in an integrated circuit process for separating integrated circuit devices on one or more semiconductor wafers from a group of integrated circuit devices undergoing test procedures, to determine a need of any additional enhanced reliability testing, the integrated circuit devices each having a substantially unique identification code, the method comprising:

storing an enhanced reliability testing flag in connection with the substantially unique identification code of each integrated circuit device of the integrated circuit devices from the group indicating whether each integrated circuit device requires the additional enhanced reliability testing;

automatically reading the substantially unique identification code of each integrated circuit device of the integrated circuit devices from the group;

accessing the enhanced reliability testing flag stored in connection with each of the automatically read substantially unique identification codes of each integrated circuit device of the integrated circuit devices from the group having the substantially unique identification code thereof read;

sorting the integrated circuit devices from the group in accordance with whether their enhanced reliability testing flag indicates the integrated circuit devices from the group come from a semiconductor wafer which is known as an unreliable semiconductor wafer; and performing testing only of integrated circuit devices in need of the additional enhanced reliability testing.

3. A method for determining at least one integrated circuit device in need of enhanced reliability testing from at least one group of integrated circuit devices undergoing test procedures, the integrated circuit devices of the at least one group each having a substantially unique identification code, the method comprising:

storing an enhanced reliability testing flag in connection with the substantially unique identification code of the at least one integrated circuit device of the integrated circuit devices in the at least one group indicating whether the at least one integrated circuit device requires the enhanced reliability testing;

automatically reading the substantially unique identification code of the at least one integrated circuit device of the integrated circuit devices in the at least one group;

accessing the enhanced reliability testing flag stored in connection with the automatically read substantially unique identification codes of the at least one integrated circuit device of the integrated circuit devices in the at least one group having the substantially unique identification code thereof read;

sorting the integrated circuit devices in the at least one group in accordance with the enhanced reliability testing flag indicating the at least one integrated circuit device in the at least one group are in need of the enhanced reliability testing; and performing testing of the at least one integrated circuit device in the at least one group only in need of the enhanced reliability testing.

* * * * *

UNITED STATES PATENT AND TRADEMARK OFFICE
CERTIFICATE OF CORRECTION

| | |
|---|---|
| PATENT NO. | : 7,368,678 B2 |
| APPLICATION NO. | : 10/218380 |
| DATED | : May 6, 2008 |
| INVENTOR(S) | : Beffa |

It is certified that error appears in the above-identified patent and that said Letters Patent is hereby corrected as shown below:

On the face page, in field (63), under "Related U.S. Application Data", in column 1, line 7, after "6,147,316" delete "." and insert -- which is a divisional of application No. 08/785,353, filed on Jan. 17, 1997, now U.S. Pat. No. 5,927,512. --, therefor.

On the face page, in field (63), under "Related U.S. Application Data", in column 1, lines 8-9, below "6,147,316." delete "(60) Provisional application No. 08/785,353, filed on Jan. 17, 1997, now Pat. No. 5,927,512.".

Signed and Sealed this

Fourteenth Day of October, 2008

JON W. DUDAS
*Director of the United States Patent and Trademark Office*